United States Patent
Koo et al.

(10) Patent No.: US 9,589,901 B2
(45) Date of Patent: Mar. 7, 2017

(54) SEMICONDUCTOR WAFERS INCLUDING INDICATIONS OF CRYSTAL ORIENTATION AND METHODS OF FORMING THE SAME

(71) Applicants: Tae-Hyoung Koo, Hwaseong-si (KR); Samjong Choi, Suwon-si (KR); Dongjun Lee, Seoul (KR); Yongsun Ko, Suwon-si (KR)

(72) Inventors: Tae-Hyoung Koo, Hwaseong-si (KR); Samjong Choi, Suwon-si (KR); Dongjun Lee, Seoul (KR); Yongsun Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/519,788

(22) Filed: Oct. 21, 2014

(65) Prior Publication Data

US 2015/0228588 A1  Aug. 13, 2015

(30) Foreign Application Priority Data

Feb. 11, 2014  (KR) .......................... 10-2014-0015631

(51) Int. Cl.
  *H01L 23/544*  (2006.01)
(52) U.S. Cl.
  CPC .. *H01L 23/544* (2013.01); *H01L 2223/54406* (2013.01); *H01L 2223/54413* (2013.01); *H01L 2223/54433* (2013.01); *H01L 2223/54453* (2013.01); *H01L 2223/54493* (2013.01); *H01L 2924/0002* (2013.01)

(58) Field of Classification Search
  None
  See application file for complete search history.

(56) References Cited

U.S. PATENT DOCUMENTS

| | | | |
|---|---|---|---|
| 5,927,263 A | 7/1999 | Muramatsu | |
| 5,993,292 A | 11/1999 | Oishi et al. | |
| 6,004,405 A * | 12/1999 | Oishi | C30B 33/00 148/33.2 |
| 6,156,676 A | 12/2000 | Sato et al. | |
| 6,710,364 B2 | 3/2004 | Guldi et al. | |
| 7,020,582 B1 | 3/2006 | Dicosola et al. | |
| 7,041,578 B2 | 5/2006 | Mahle et al. | |
| 7,371,659 B1 | 5/2008 | Yamamoto et al. | |
| 7,915,564 B2 | 3/2011 | Kaplan et al. | |
| 8,129,203 B2 | 3/2012 | Chang et al. | |
| 8,334,150 B2 | 12/2012 | Kuan et al. | |
| 2003/0015806 A1 | 1/2003 | Chiba et al. | |
| 2007/0228400 A1* | 10/2007 | Fujita | C30B 29/406 257/94 |

(Continued)

FOREIGN PATENT DOCUMENTS

KR  10-0458694 B1  11/2004
KR  10-0697899 A  3/2007

(Continued)

*Primary Examiner* — Ali Naraghi
(74) *Attorney, Agent, or Firm* — Ward and Smith, P.A.

(57) ABSTRACT

A wafer can be provided to include a single crystalline semiconductor material with a predetermined crystal orientation. The wafer can include a laser mark at a determined position on a front surface or on a back surface of the wafer, where the determined position is configured to indicate the predetermined crystal orientation of the single crystalline semiconductor material.

20 Claims, 23 Drawing Sheets

(56) References Cited

U.S. PATENT DOCUMENTS

2010/0001416 A1    1/2010  Tsai et al.
2012/0223335 A1*   9/2012  Tsuchiya .................. B41M 5/26
                                                    257/77

FOREIGN PATENT DOCUMENTS

KR    10-0697899 B1    3/2007
KR    10-0965216       6/2010

* cited by examiner

M2

SEMICONDUCTOR WAFERS INCLUDING INDICATIONS OF CRYSTAL ORIENTATION AND METHODS OF FORMING THE SAME

CROSS-REFERENCE TO RELATED APPLICATIONS

This U.S. non-provisional patent application claims priority under 35 U.S.C. §119 to Korean Patent Application No. 10-2014-0015631, filed on Feb. 11, 2014, in the Korean Intellectual Property Office, the entire content of which is incorporated herein by reference.

FIELD

The inventive concept generally relates to the processing of semiconductor wafers.

BACKGROUND

A semiconductor wafer can be produced using a Czochralski growth process to form a semiconductor ingot having a particular crystal orientation. The ingot can be sliced into separate wafers, which can then be subjected to edge-grinding and surface-polishing.

Semiconductor chips can be fabricated on the wafers at a specific orientation relative to the particular crystal orientation to achieve desired performance characteristics, such as a particular charge carrier mobility. The particular crystal orientation can be determined using, for example, X-ray diffraction techniques. Once the particular crystal orientation of semiconductor wafer is known, the edge of the wafer can be flattened (i.e., a flat zone) to indicate a particular direction relative to the known particular crystal orientation. It is also known to form a notch in the edge of the wafer to indicate a particular direction relative to the known particular crystal orientation. The flat zone or notch can be used during subsequent processing steps to align the wafer in a particular direction, such as during an implant.

SUMMARY

Embodiments according to the inventive concept can provide semiconductor wafers with indications of crystal orientation and methods of forming the same. Pursuant to these embodiments, a wafer can be provided to include a single crystalline semiconductor material with a predetermined crystal orientation. The wafer can include a laser mark at a determined position on a front surface or on a back surface of the wafer, where the determined position is configured to indicate the predetermined crystal orientation of the single crystalline semiconductor material.

In some embodiments according to the inventive concept, the laser mark can be a first laser mark having a bottom at a first depth, and the wafer can further include a second laser mark on the front surface or on the back surface of the wafer, where the second laser mark can have a bottom at a second depth that is less than the first depth.

In some embodiments according to the inventive concept, the first laser mark is deeper than the second laser mark by at least about 5 micrometers. In some embodiments according to the inventive concept, the first laser mark is deeper than the second laser mark by at least about 5 micrometers to about 10 micrometers.

In some embodiments according to the inventive concept, the first laser mark and the second laser mark are separated on the front surface or on the back surface of the wafer by a predetermined spacing. In some embodiments according to the inventive concept, the second laser mark is included in indicia that uniquely identifies the wafer and/or a wafer lot in which the wafer is included. In some embodiments according to the inventive concept, the first laser mark is included in the indicia. In some embodiments according to the inventive concept, the indicia can be an alphanumeric code, a bar code, and/or a QR code. In some embodiments according to the inventive concept, the indicia is in a reserved area of the front surface or the back surface of the wafer that is predetermined to include the indicia.

In some embodiments according to the inventive concept, the laser mark is configured to indicate the predetermined crystal orientation with a line extending from a center of the wafer to the laser mark. In some embodiments according to the inventive concept, the predetermined crystal orientation is derived using a mathematical transformation of the line.

In some embodiments according to the inventive concept, the laser mark can be a first laser mark having a bottom at a first depth, and the wafer can further include a second laser mark having a bottom at the first depth, where the first and second laser marks can be positioned on the front surface or on the back surface of the wafer to indicate the predetermined crystal orientation with a line extending from the first laser mark to the second laser mark.

In some embodiments according to the inventive concept, the laser mark can be a first laser mark of a plurality of first laser marks on the front surface or on the back surface of the wafer, where the plurality of first laser marks can be indicia that uniquely identifies the wafer and/or a wafer lot within which the wafer is included.

In some embodiments according to the inventive concept, the wafer can further include an edge surface providing a circumference of the wafer, wherein the edge surface extends from the front surface of the wafer to the back surface of the wafer. In some embodiments according to the inventive concept, the edge surface is beveled toward the front surface of the wafer and toward the back surface of the wafer. In some embodiments according to the inventive concept, the first laser mark can overlap the second laser mark on the front or back surface of the wafer.

In some embodiments according to the inventive concept, a wafer including a single crystalline semiconductor material with a predetermined crystal orientation, can further include a first recess having a bottom at a first depth at a first determined position on a first surface of the wafer, the first determined position can be configured to indicate the predetermined crystal orientation of the single crystalline semiconductor material. A second recess can have a bottom at a second depth at a second determined position on a second surface of the wafer, wherein the first depth is greater than the second depth.

In some embodiments according to the inventive concept, a wafer including a single crystalline semiconductor material with a predetermined crystal orientation, can further include a first laser mark at a determined position on a front surface or on a back surface of the wafer, where the first laser mark can have a bottom at a first depth. A second laser mark can be on the front surface or on the back surface of the wafer, the second laser mark having a bottom at a second depth that is less than the first depth.

In some embodiments according to the inventive concept, a method of processing a wafer including a single crystalline semiconductor material, can be provided by determining a crystal orientation of the single crystalline semiconductor material to provide a predetermined crystal orientation of the single crystalline semiconductor material. A first recess can be formed to provide a bottom at a first depth, in a front surface or in a back surface of the wafer, at a first position on the wafer to indicate the predetermined crystal orientation of the single crystalline semiconductor material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF EMBODIMENTS ACCORDING TO THE INVENTIVE CONCEPT

Figure 1:
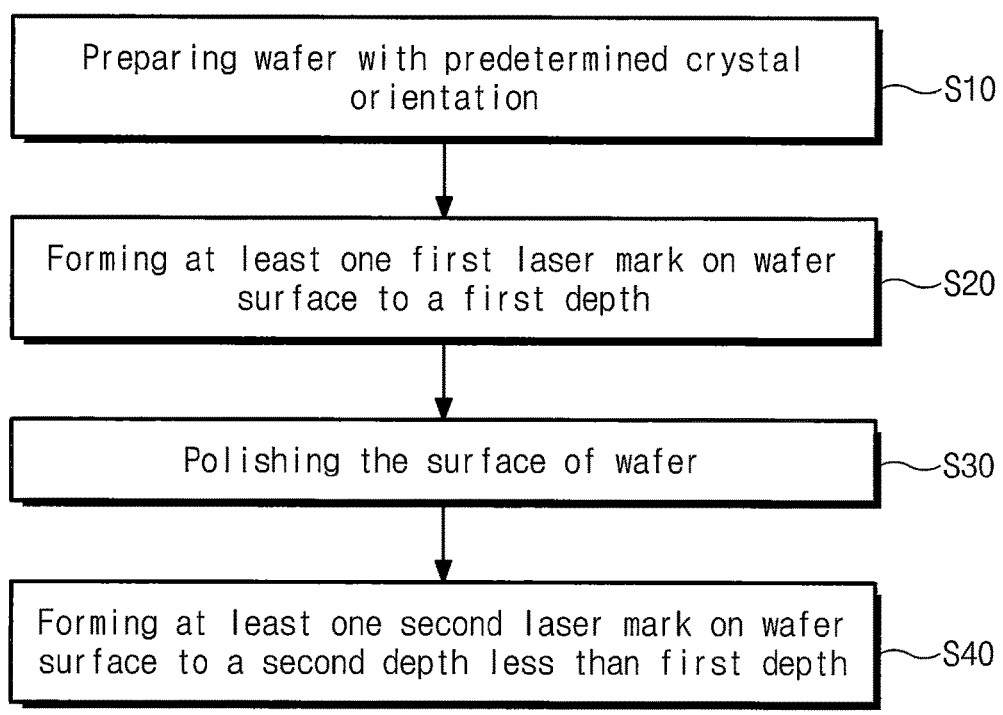
FIG. 1 is a flowchart illustrating wafer production methods according to example embodiments of the inventive concept.

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are used only to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "front", "back", "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "a front surface" would then be oriented as a "back surface". Thus, the exemplary term "front" can encompass both an orientation of "front" and "back". The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flowchart illustrating wafer production methods according to example embodiments of the inventive concept.

Referring to FIG. 1, a wafer production method may include preparing a wafer with a predetermined crystal orientation (in S10), forming at least one first laser mark on a surface of the wafer to a first depth (in S20), polishing the surface of the wafer (in S30), and forming at least one second laser mark on the surface of the wafer to a second depth that is less than the first depth (in S40). Hereinafter, the first and second laser marks may also be referred to as first and second marks, respectively.

The steps performed before the polishing step of S30 may vary depending on the predetermined crystal orientation of the wafer and/or how the crystal orientation of the wafer is marked.

For example, the predetermined crystal orientation of the wafer may be marked with a flat zone or notch.

Figure 2A:
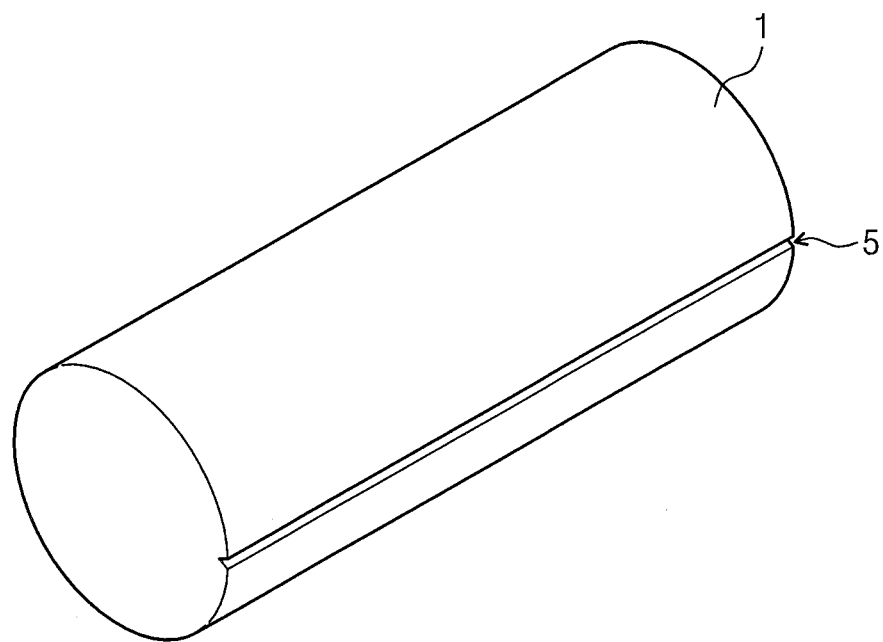
FIGS. 2A and 2B are perspective views illustrating a portion of a wafer production process according to example embodiments of the inventive concept.
Figure 2B:
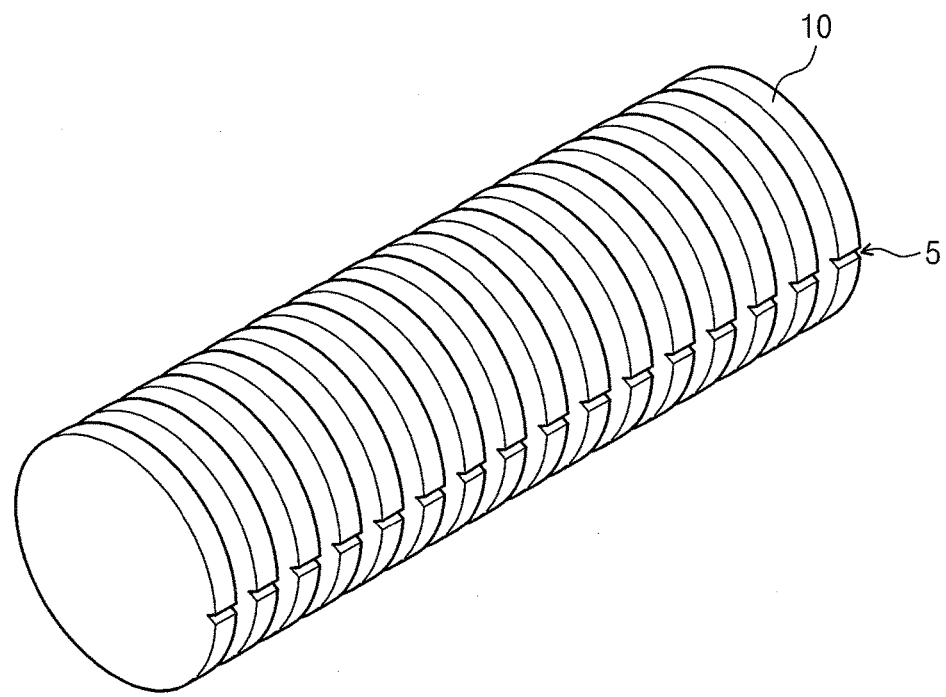
Figure 2C:
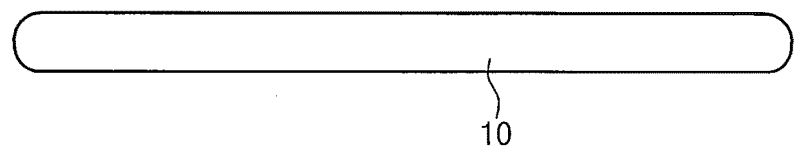
FIG. 2C is a sectional view illustrating a wafer having a ground edge.

FIGS. 2A and 2B are perspective views illustrating a portion of a wafer production process according to example embodiments of the inventive concept. FIG. 2C is a sectional view illustrating a wafer, having a ground edge.

Referring to FIG. 2A, a semiconductor ingot 1 may be formed using the Czochralski process to have a single crystalline structure. By removing cone-shaped end portions of the semiconductor ingot 1, the semiconductor ingot 1 may be prepared to have a cylindrical shape. The crystal orientation of the semiconductor ingot 1 may be determined using, for example, an X-ray diffraction technique. Thereafter, in order to indicate the predetermined crystal orientation of the semiconductor ingot 1, a flat zone or notch 5 may be formed on an outer sidewall (or edge) of the semiconductor ingot 1. For example, the notch 5 may be formed to indicate the orientation of the [011] crystal plane in the semiconductor ingot 1.

Referring to FIG. 2B, the semiconductor ingot 1 may be sliced into a plurality of wafers 10. The slicing may be performed using a technique such as an outer-diameter saw (ODS), an inner-diameter saw (IDS), a wire saw (WS), etc. Here, in the case of the ODS method, a thin plate, whose outer circumference is coated with diamond particles, may be used to cut the semiconductor ingot 1, and in the case of the IDS method, a donut-shaped plate, with an internal circumference coated with diamond particles, may be used to cut the semiconductor ingot 1. In the case of the WS method, a slurry solution may be sprayed on a high-tension wire (e.g., piano wire) moving with a high speed, and in this case, the semiconductor ingot 1 may be cut by friction between the slurry and the semiconductor ingot 1. In certain embodiments, the wafers 10 may be prepared in such a way that crystal orientations of top and bottom surfaces thereof become [100] plane of the crystal structure of the wafer.

Referring to FIG. 2C, an edge grinding process may be performed to round the outer circumference of the wafer 10, on which the flat zone or notch 5 is formed. Thereafter, the first laser mark may be formed on the wafer 10 (in S20).

As appreciated by the present inventors, the formation of the flat zone or notch 5 may reduce an effective area of the wafer 10 for semiconductor chips and cause problems, such as defects or particles, in a subsequent thin-film deposition process, and thus, in certain embodiments, the formation of the flat zone or notch may be omitted.

Figure 3A:
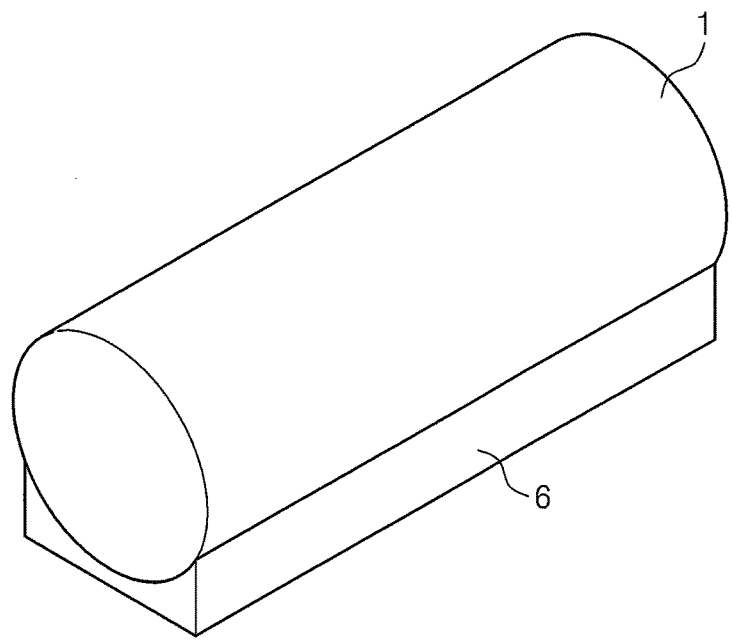
FIGS. 3A and 3B are perspective views illustrating a portion of a wafer production process according to example embodiments of the inventive concept.
Figure 3B:
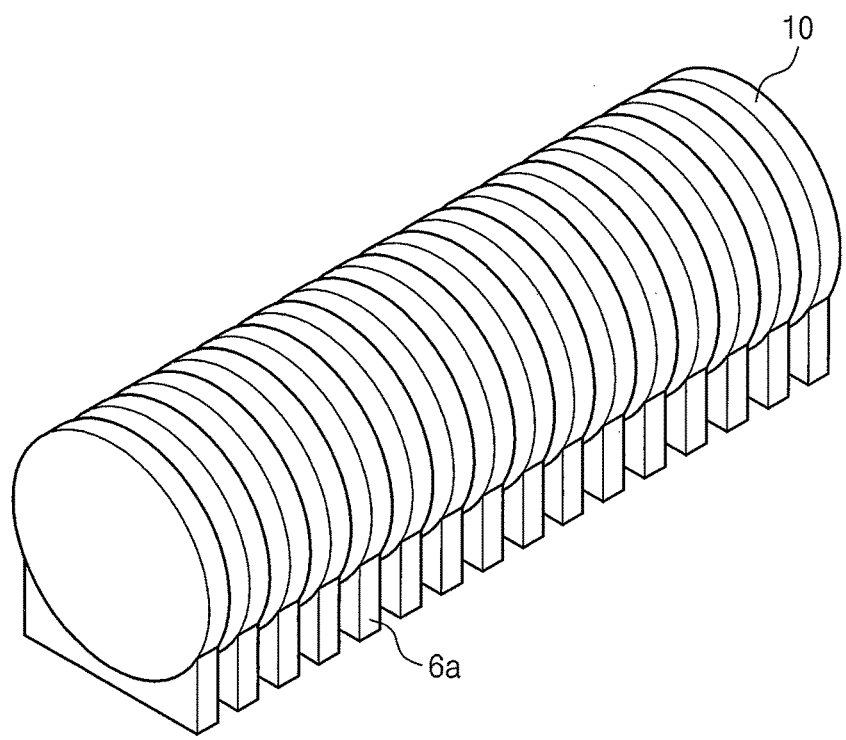

FIGS. 3A and 3B are perspective views illustrating a portion of a wafer production process according to example embodiments of the inventive concept.

Referring to FIG. 3A, to indicate the predetermined crystal orientation of the semiconductor ingot 1, a supporter 6 may be attached along a portion of an outer wall of the semiconductor ingot 1. For example, a center of the supporter 6 may indicate [011] crystal orientation of the ingot 1. The supporter 6 may be formed of, for example, silicon carbide (SiC).

Referring to FIG. 3B, the semiconductor ingot 1 attached on the supporter 6 may be cut into a plurality of wafers 10. The semiconductor ingot 1 may be cut in such a way that the crystal orientations of top and bottom surfaces of the wafer 10 become [100] plane. In certain embodiments, during the cutting process, the supporter 6 may also be cut into a plurality of supporter pieces 6a along with the wafers 10. Thereafter, the first laser mark may be formed on the wafer 10, to which the supporter piece 6a is attached (in S20). The supporter piece 6a may be removed, and the edge grinding process may be performed to round the outer circumference of the wafer 10.

Figure 4A:
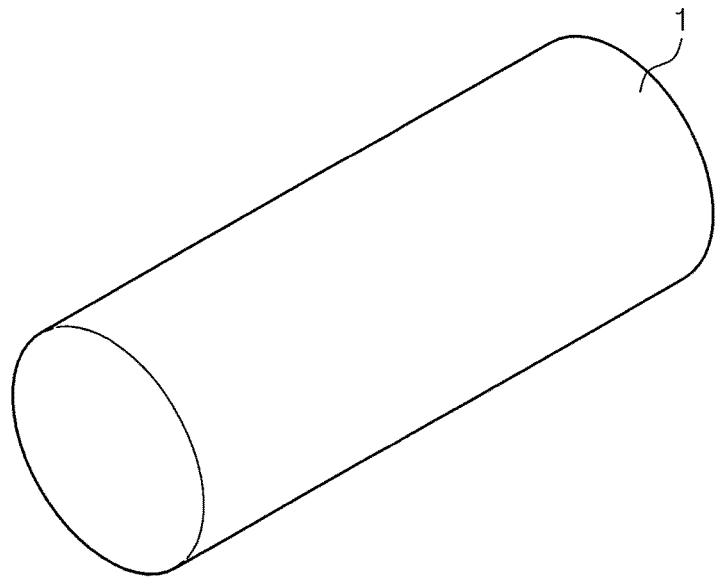
FIGS. 4A and 4B are perspective views illustrating a portion of a wafer production process according to example embodiments of the inventive concept.
Figure 4B:
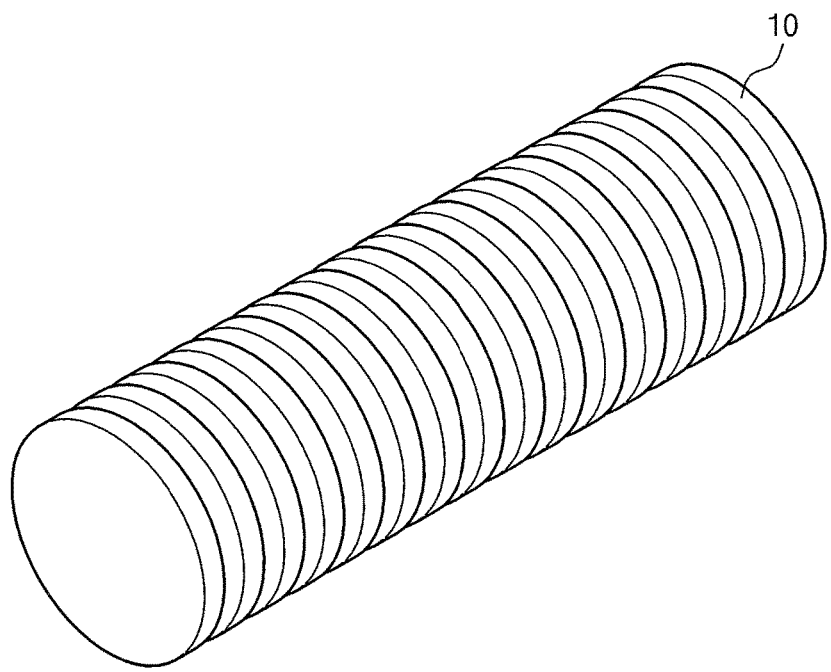

FIGS. 4A and 4B are perspective views illustrating a portion of a wafer production process according to example embodiments of the inventive concept, in which a flat zone or notch 5 is not formed. Referring to FIGS. 4A and 4B, the semiconductor ingot 1 may be cut into a plurality of wafers 10. The semiconductor ingot 1 may be cut in such a way that the crystal orientations of front and back surfaces of the wafer 10 become [100] plane. The edge grinding process may be performed to round the outer circumference of the wafer 10.

Thereafter, a crystal orientation of each wafer 10 may be examined using, for example, an X-ray diffraction technique, and then, a first laser mark M1 may be formed at a determined location on a surface of the wafer 10 (in S20) which is configured to indicate the predetermined crystal orientation. For example, the first laser mark M1 may be formed at the determined location on the surface so that a line that extends from a center of the wafer 10 through the determined location is parallel to the crystal plane of [011]. That is, the first laser mark M1 may indicate the predetermined crystal orientation of [011] of the wafer 10. The process may be performed to each of the wafers 10.

The first laser mark M1 may be formed to have a bottom at a first depth of 5 μm or greater. The first laser mark M1 may be formed by a hard laser marking process. The first laser mark M1 may be formed on at least one of front, back, and side surfaces of the wafer 10. The first laser mark M1 may serve as indicia of the predetermined crystal orientation of the single crystalline semiconductor in the wafer 10. Accordingly, the first laser mark M1 can be configured to indicate the predetermined crystal orientation of the semiconductor wafer 10 using the depth of the mark or the shape, or a combination thereof.

To avoid technical problems associated with the flat zone or notch, an edge grinding process may be performed to remove the flat zone or notch, after the formation of the first laser mark M1. Alternatively, the edge grinding process may be performed after the surface polishing process S30.

The surface polishing process S30 may be performed to both of the front and back surfaces of the wafer 10. In the surface polishing process S30, the wafer 10 may be fastened to a carrier, and then, be mechanically and/or chemically polished by a polishing pad, on which polishing slurry is supplied. As the result of the surface polishing process S30, the wafer 10 may have a reduced thickness. By performing the surface polishing process S30, it is possible to reduce the variation in thickness of the wafers 10, which may occur when the wafers 10 are cut, and thereby to improve uniformity in wafer thickness.

A second laser mark M2 may be formed to have a bottom at a second depth of 5 μm or less in S30. The second laser mark M2 may be formed by a soft laser marking process. The second laser mark M2 may be formed on at least one of the front, back, and side surfaces of the wafers 10. In certain embodiments, the second laser mark M2 may overlap the first laser mark M1. In example embodiments, a plurality of the second laser marks M2 may be provided to constitute one of letter, character, sign, symbol, serial number, quick response (QR) code, or bar code indicating information on the wafer 10. For example, the plurality of the second laser marks M2 may be formed to indicate the predetermined crystal orientation of the crystalline semiconductor in the wafer 10.

The first laser mark M1 may be removed after the formation of the second laser mark M2 (in S40). Further, a cleaning process may be performed after the formation of the second laser mark M1. Example embodiments of the inventive concept are described in more detail below. For example, S20 to S40 of FIG. 1 are described in more detail below.

It will be understood that the term "laser mark" includes indicia placed on a surface of the wafer that is recognizable by semiconductor processing equipment for the purpose of orienting the wafer 10 as desired. The laser mark can be made using any laser configured to mark the surface in a way such that it may be distinguished. In some embodiments, the laser mark may create a recess in the surface. In some embodiments, the laser mark may create a recognizable symbol on the surface without forming a substantial recess. In some embodiments, a device other than a laser may used to create a recognizable symbol on the surface or a recess in the surface.

Figure 5A:
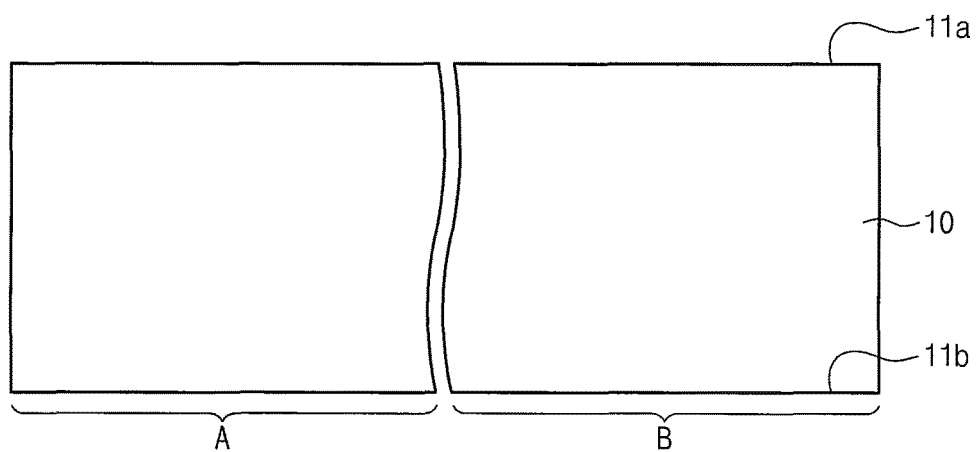
FIGS. 5A through 5D are sectional views illustrating wafer production methods according to example embodiments of the inventive concept.

FIGS. 5A through 5D are sectional views illustrating wafer production methods according to example embodiments of the inventive concept. Referring to FIG. 5A, the wafer 10 may include a first surface 11a and a second surface 11b facing away from each other. The wafer 10 may include a first region A and a second region B. One of the first and second surfaces 11a and 11b may be the front surface of the wafer 10, and the other may be the back surface of the wafer 10. In this stage, the crystal orientation of the wafer 10 has been determined.

Figure 5B:
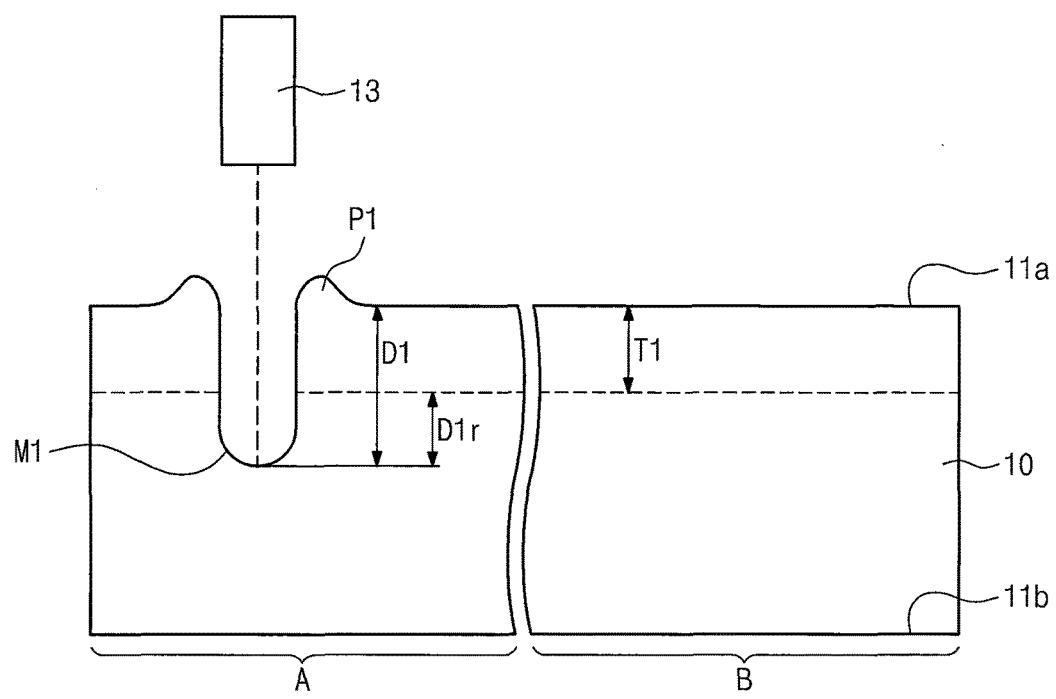

Referring to FIG. 5B, a first laser mark M1 may be formed in the first surface 11a of the wafer 10 to indicate the predetermined crystal orientation of the wafer 10. For example, the first laser mark M1 may be formed on a line that extends from a center of the wafer 10, and which is parallel to the predetermined crystal orientation, such as [011]. Alternatively, the first laser mark M1 may be formed at a position rotated from the notch 5 or a center of the supporter piece 6a by a specific angle. The crystal orientation of the wafer 10 may be denoted by the position of the first laser mark M1. Accordingly, a desired plane of the crystal can be determined by a mathematical transformation from the predetermined crystal orientation.

The first laser mark M1 may be formed in the first surface 11a in the first region A. The first laser mark M1 may be formed using a first laser generator 13. The first laser generator 13 may be configured to generate a laser beam, having an energy level that is within a range of hard laser marking, such as laser light having a wavelength of about 860 nanometers to about 1200 nanometers at an energy of about 1550 u joules/cm2 to about 1650 u joules/cm2 in a single pulse having a duration of about 10 ms.

The first laser mark M1 may be formed to have a bottom at a first depth D1. The first depth D1 may be greater than 5 μm, and in certain embodiments, it may be equal to or greater than 45 μm. The first laser mark M1 may be formed by melting a portion of the wafer 10 with the laser beam, and thus, a protrusion P1 may be formed near the first laser mark M1 on the first surface 11a. The first laser mark M1 may be configured to allow a position perceiving system to detect the presence thereof, and in this sense, the number of first laser marks M1 may be varied. In example embodiments, at least one first laser mark M1 may be formed in the surface of the wafer 10.

Figure 5C:
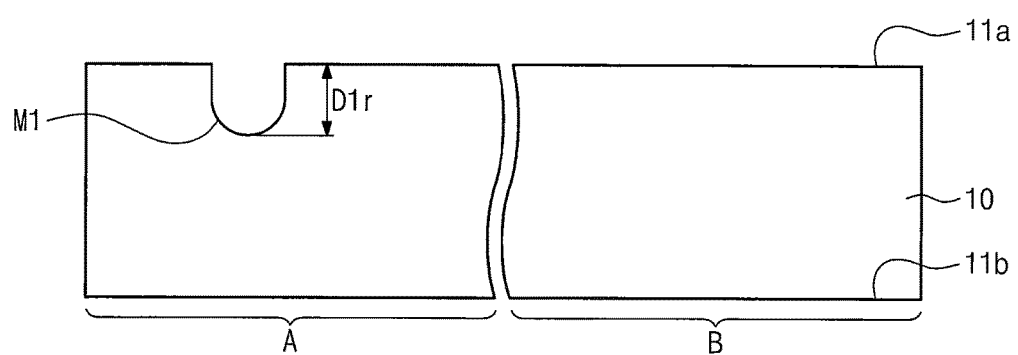

Referring to FIGS. 5B and 5C, the surface polishing process S30 may be performed to remove a top portion T1 of the wafer 10. Accordingly, the first laser mark M1 may have a first remaining depth D1r that is less than the first depth D1. In certain embodiments, the first remaining depth D1r may be equal to or greater than 35 μm.

Figure 5D:
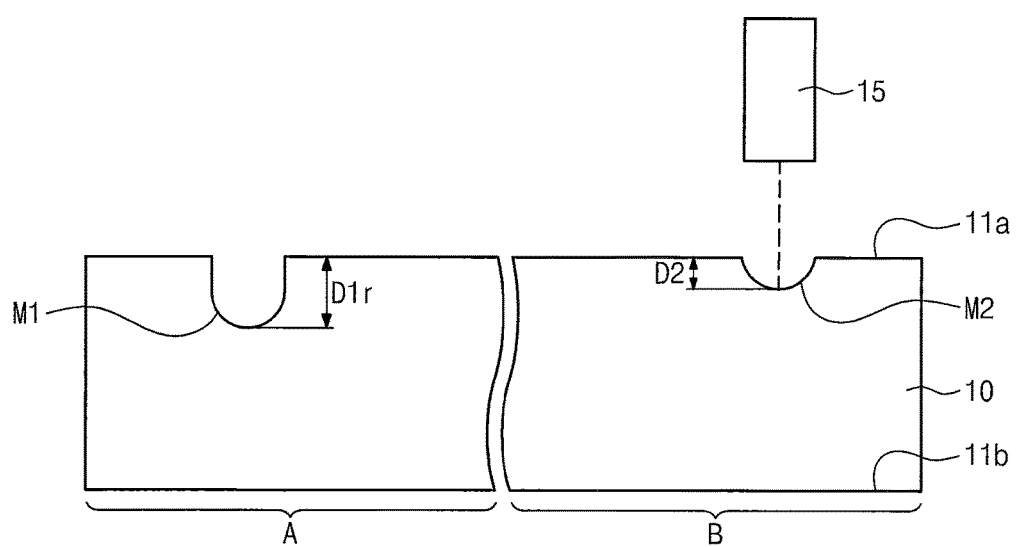

Referring to FIG. 5D, a second laser mark M2 may be formed in the surface 11a. A position of the second laser mark M2 may be determined on the basis of that of the first laser mark M1. The second laser mark M2 may be formed in the second region B. The second laser mark M2 may be formed using a second laser generator 15. The second laser generator 15 may be configured to generate a laser beam, having an energy level that is in the energy range of soft laser marking, such as laser light having a wavelength of about 860 nanometers to about 1200 nanometers at an energy of about 400 u joules/cm2 to about about 600 u joules/cm2 in a single pulse having a duration of about 10 ms.

The second laser mark M2 may be formed to have a bottom at a second depth D2. The second depth D2 may be equal to or less than 5 In certain embodiments, the second laser generator 15 may be the same as the first laser generator 13, where a laser generating condition for the second laser mark M2 is different from that used to form the first laser mark M1. The second laser mark M2 may be formed using a laser beam, having an energy level that is less than that used to form the first laser mark M1, and this makes it possible to prevent a protrusion associated with the second laser mark M2 from being formed. Thereafter, a cleaning process may be performed.

The first laser mark M1 may be formed to have a dot-like shape. The second laser mark M2 may be formed to have a dot-like shape or continuous line shape. Other shapes may be used.

Figure 6A:
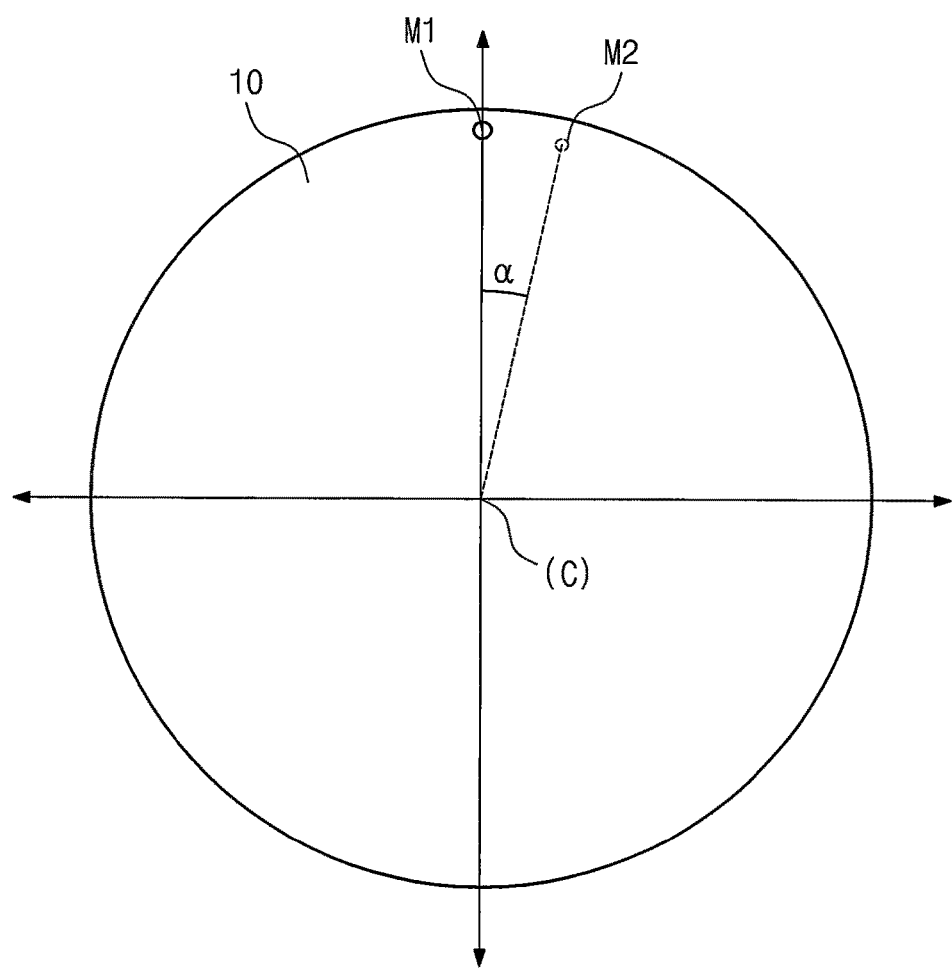
FIGS. 6A through 6C are plan views of wafers according to example embodiments of the inventive concept.
Figure 6B:
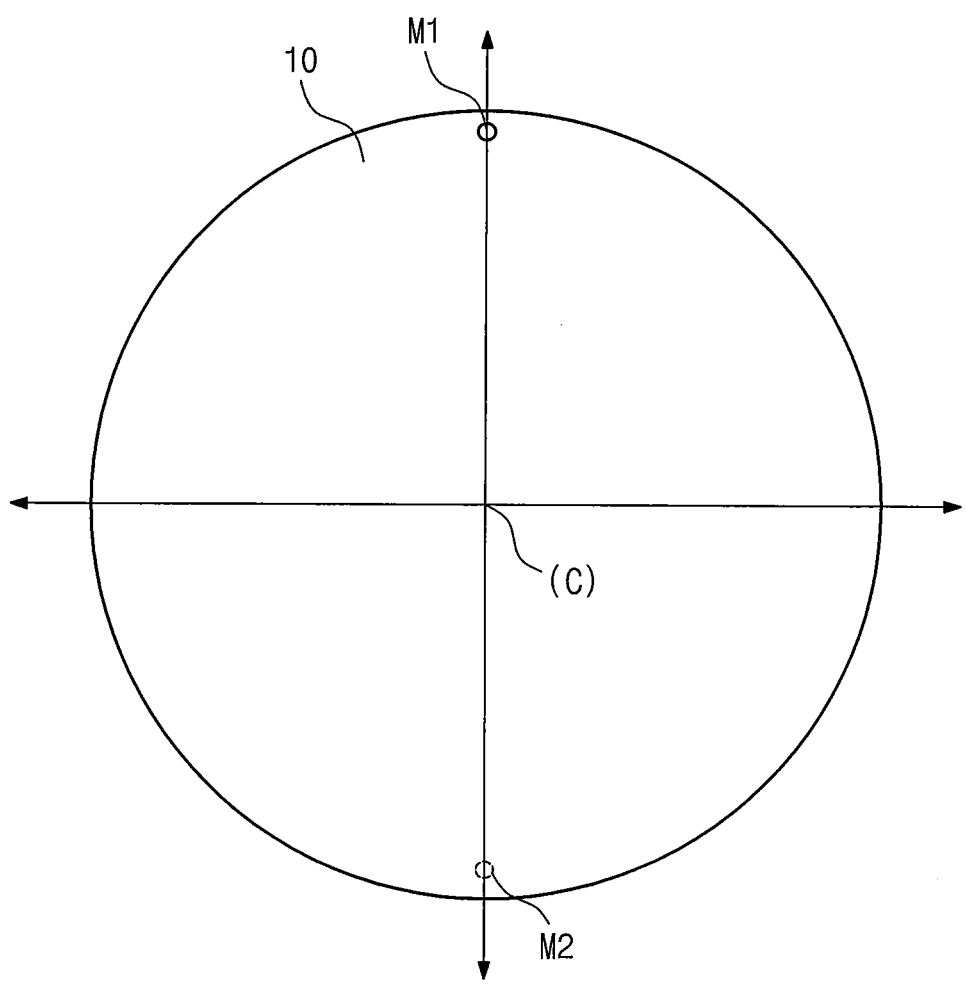
Figure 6C:
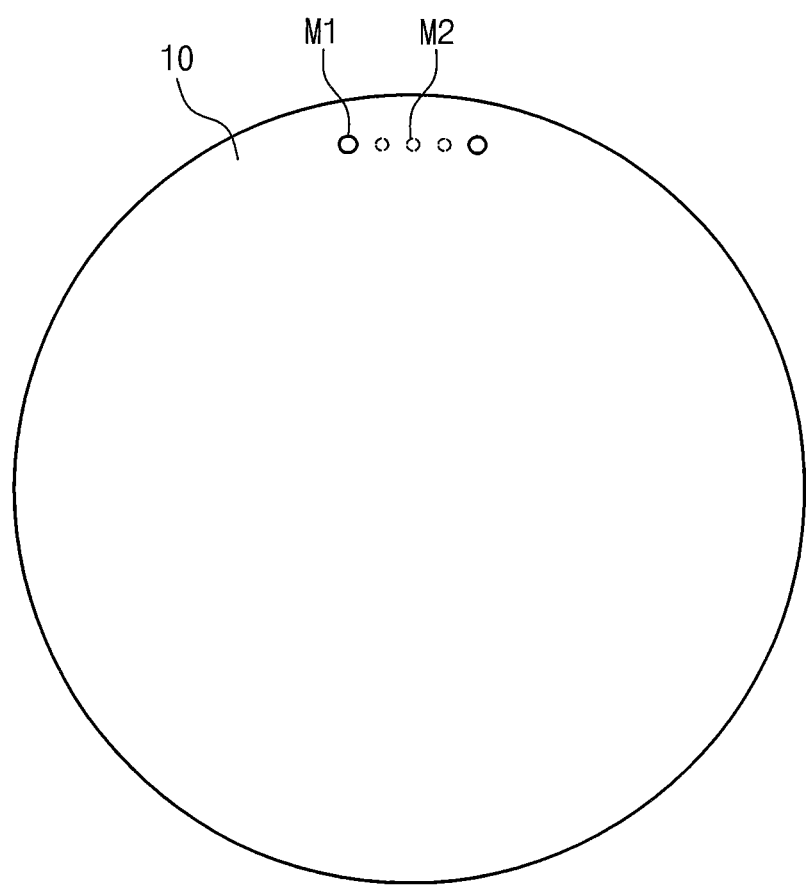

FIGS. 6A through 6C are plan views of wafers produced by methods according to example embodiments of the inventive concept.

Referring to FIG. 6A first laser mark M1 and the second laser mark M2 may be disposed adjacent to each other, on a (or "the top") surface of the wafer 10. According to Miller index notation in the rectangular coordinate system, the exposed top surface of the wafer 10 may be the (100) plane. The first laser mark M1 may be formed on a line extending from a center (c) of the wafer 10 to indicate a crystal orientation of [011]. The second laser mark M2 may be formed at a another position rotated from the first laser mark M1 about the center of the wafer 10 by a first angle α. As further shown in FIG. 6A, the first laser mark M1 is formed remote from the center (c) adjacent to an outer edge of the surface of the wafer 10.

Alternatively, as shown in FIG. 6B, the first laser mark M1 and the second laser mark M2 may be formed at opposite sides of the wafer 10 in respective edge regions. For example, the first laser mark M1 may be formed on a line extending from the center (c) of the wafer 10, which is parallel to the crystal orientation of [011], while the second laser mark M2 may be formed at a position rotated by 180 degrees from the first laser mark M1 about the center (c) of the wafer 10.

In still other embodiments, a plurality (e.g., three) of second laser marks M2 may be disposed between at least one pair of first laser marks M1 on the top surface of the wafer 10, as shown in FIG. 6C. The arrangement shown in FIG. 6C may enable multiple laser marks to indicate the predetermined crystal orientation.

Figure 7A:
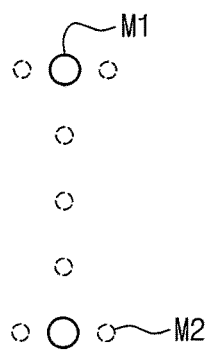
FIGS. 7A through 7C are plan views of representations of alphanumeric characters represented by laser marks, according to example embodiments of the inventive concept.
Figure 7B:
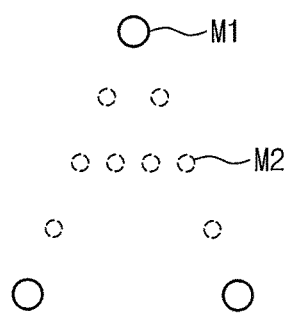
Figure 7C:
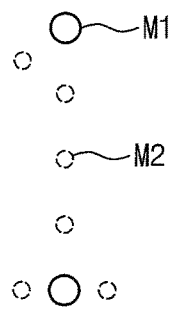

FIGS. 7A through 7C are plan views of indicia including letters, figures or characters that are formed by laser marks, according to example embodiments of the inventive concept.

First and second laser marks M1 and M2 may be arranged to indicate a variety of alphanumeric characters, such as the letter "I" of FIG. 7A, the letter "A" of FIG. 7B, and the number "1" of FIG. 7C. In the case where two or more first laser marks M1 are formed on the wafer 10, a space between adjacent two of the first laser marks M1 may be larger than a space between adjacent two of the second laser marks M2.

Figure 8A:
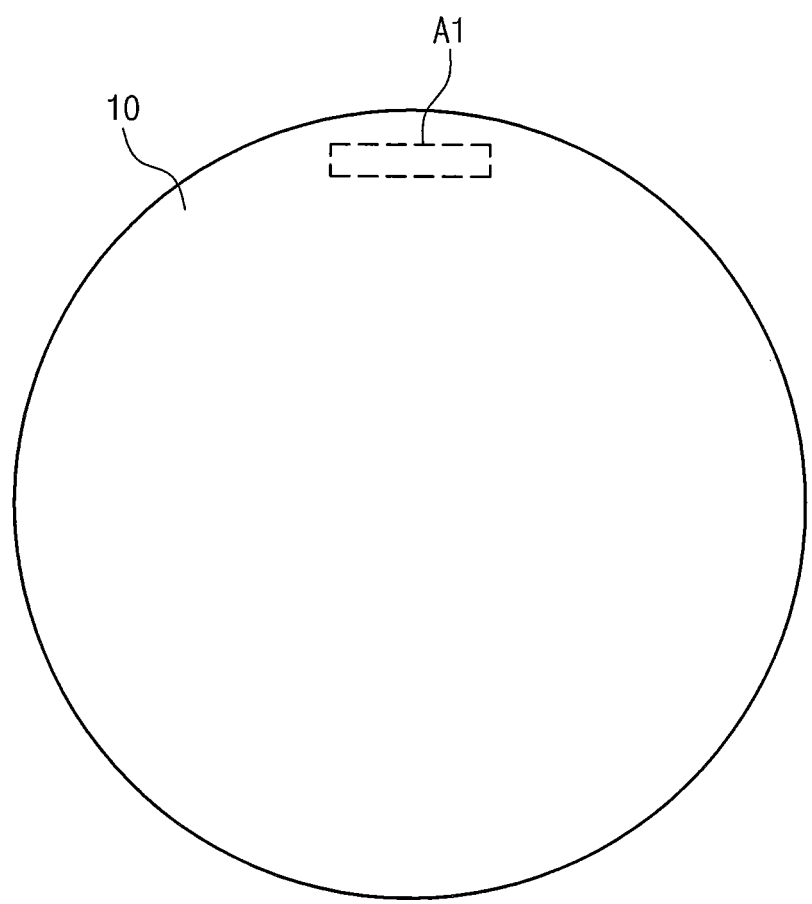
FIGS. 8A and 8B are plan views of wafers according to example embodiments of the inventive concept.
Figure 8B:
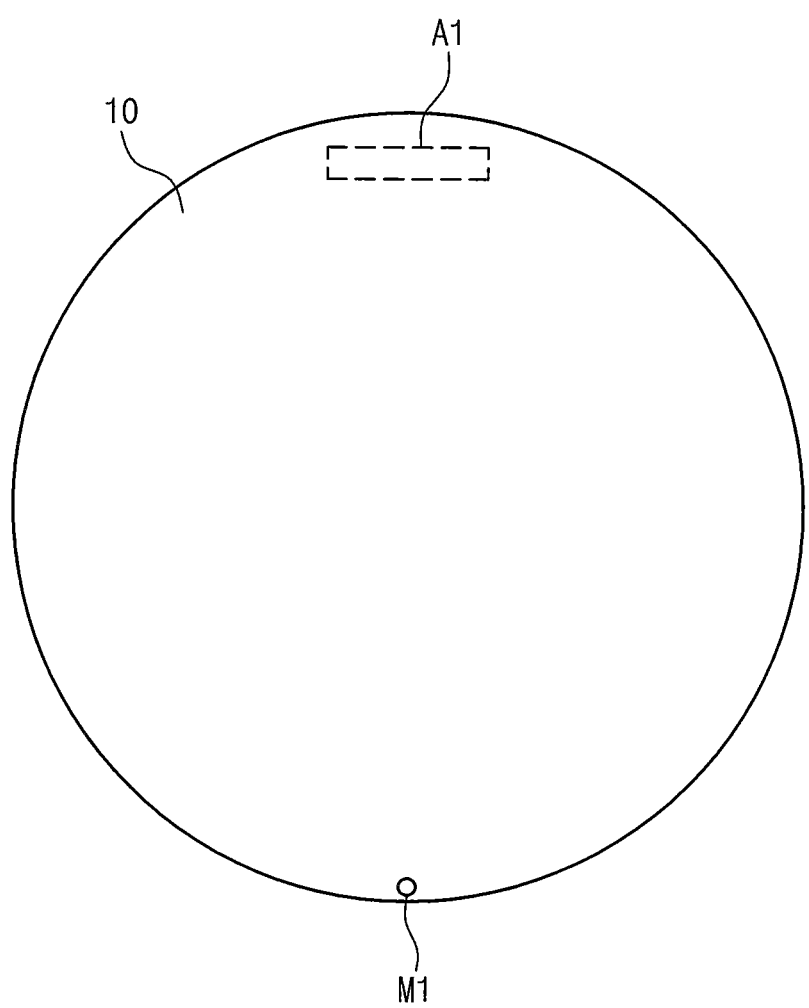
Figure 9A:
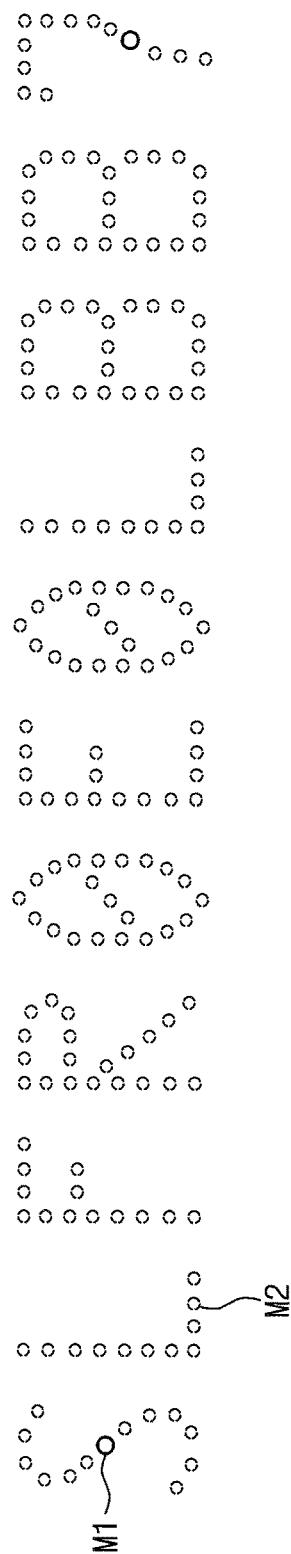
FIGS. 9A and 10A are diagrams illustrating serial numbers on wafers according to example embodiments of the inventive concept.
Figure 9B:
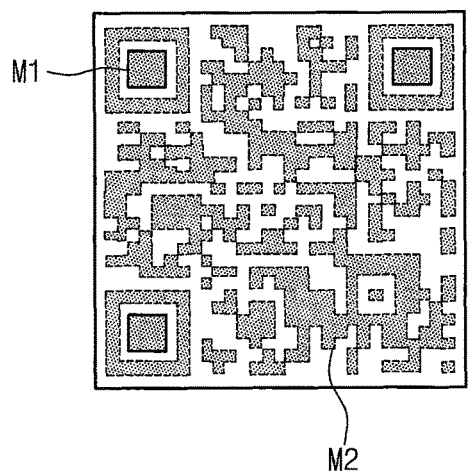
FIGS. 9B and 10B are diagrams illustrating QR codes on wafers according to example embodiments of the inventive concept.
Figure 9C:
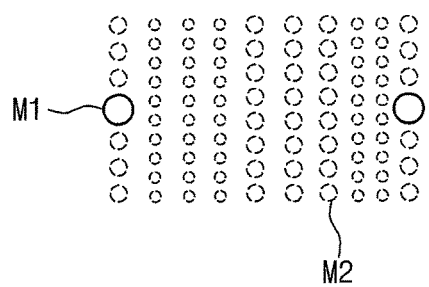
FIGS. 9C and 9D are diagrams illustrating bar codes on wafers according to example embodiments of the inventive concept.
Figure 9D:
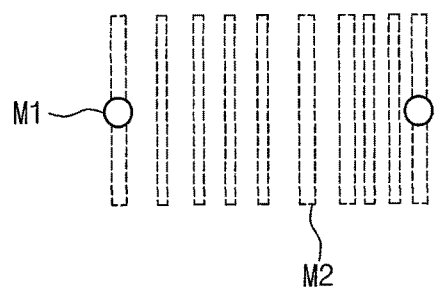
Figure 10A:
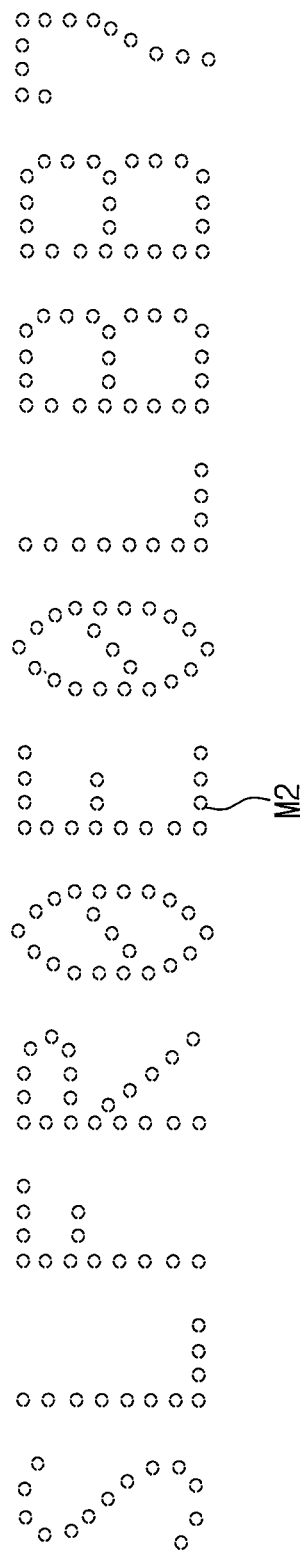
Figure 10B:
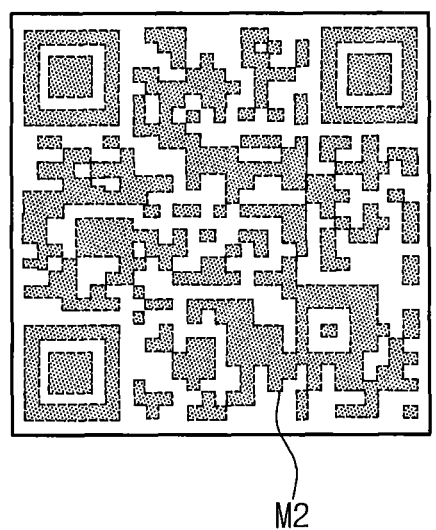

FIGS. 8A and 8B are plan views of wafers produced by methods according to example embodiments of the inventive concept. FIGS. 9A and 10A are diagrams illustrating indicia of serial numbers according to example embodiments of the inventive concept. FIGS. 9B and 10B are diagrams of indicia of QR codes according to example embodiments of the inventive concept. FIGS. 9C and 9D are diagrams illustrating indicia of bar codes according to example embodiments of the inventive concept.

As shown in FIG. 8A, a laser mark region A1 may be provided on the wafer 10 as a portion of the surface of the wafer 10 that is reserved for indicia. First laser marks M1 and the second laser marks M2 may be formed in the laser mark region A1 to constitute a serial or lot number as shown in FIG. 9A, a quick response (QR) code as shown in FIG. 9B, or a bar code as shown in FIGS. 9C and 9D. Each of the second laser marks M2 may be in the shape of a dot as shown in FIG. 9C or a line as shown in FIG. 9D.

Alternatively, as shown in FIG. 8B, the laser mark region A1 and the first laser mark M1 may be disposed spaced apart from each other on the wafer 10. Only second laser marks M2 may be disposed in the laser mark region A1 as part of a serial or lot number as shown in FIG. 10A or a quick response (QR) code as shown in FIG. 10B. The serial or lot number, the QR code, or the bar code may be configured to indicate various information associated with the wafer (for example, production year, production date, manufacturer, production condition, production history, diameter, thickness, sheet resistance, doping type, and lot number of the wafer).

According to example embodiments of the inventive concept, the number of the first laser marks M1 having a great depth is reduced or minimized in the wafer 10, and information on the wafer 10 may be represented by the second laser marks M2, whose depth is less than that of the first laser mark M1, and which are formed after the surface polishing. Second laser marks may have a depth of 5 μm or less, and the first laser marks M1 may have a depth larger than 5 μm as appreciated by the present inventors.

Since first laser marks M1 may be vulnerable to pressure applied to the wafer by a carrier, the greater the number of first laser marks M1 used, the greater the possibility of breakage of the wafer 10 in the surface polishing process (in S30). Further, in several chip fabrication processes, such as deposition, etching, and cleaning processes, particles or layers may be formed in first laser marks M1, which may lead to a process failure. Nevertheless, first laser marks M1 are used to indicate the predetermined crystal orientation of the wafer 10. In contrast, second laser marks M2 may not result in the breakage of the wafer 10 or the process failure associated with the particles due to the fact that second laser marks M2 are relatively shallow. Accordingly, where the number of the first laser marks M1 is reduced and information on the wafer 10 is represented by second laser marks M2, it is possible to reduce the likelihood of a process failure.

Subsequently, a chip fabrication process may be performed to the wafer 10. For example, a photoresist layer may be formed on the wafer 10, and an exposure process may be performed to the photoresist layer to form photoresist patterns. In an initial stage of the chip fabrication process, second laser marks M2 may be detected by an exposure system, and thus, align marks may be formed during the exposure process in the initial stage. In the case where many layers are formed on the wafer 10 in the subsequent processes, the second laser marks M2 may be hardly perceived by a fabrication system. Nevertheless, since align marks are sequentially formed in subsequent exposure processes, the positional information of the wafer 10 can be traced by the fabrication system.

The predetermined crystal orientation of the wafer 10 may be represented by a determined position of the second laser mark M2. Alternatively, the second laser mark M2 may be formed to represent information other than the predetermined crystal orientation of the wafer.

FIGS. 11A through 11D are sectional views illustrating wafer production methods according to example embodiments of the inventive concept.

Figure 11A:
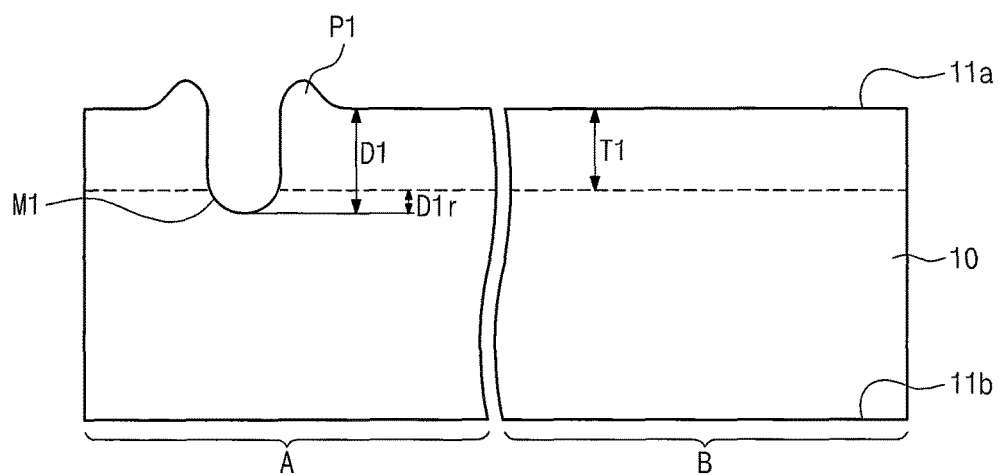
FIGS. 11A through 11D are sectional views illustrating wafer production methods according to example embodiments of the inventive concept.

Referring to FIG. 11A, a first laser mark M1 may be formed on the wafer 10 to indicate the predetermined crystal orientation of the wafer 10. One of the first and second surfaces 11a and 11b may be the front surface of the wafer 10, and the other may be the back surface of the wafer 10. The first laser mark M1 may be formed in the first surface 11a on the first region A. The first laser mark M1 may be formed by a laser beam, having an energy level that is in the energy range of hard laser marking. The first laser mark M1 may be formed to have a bottom at a first depth D1. The first depth D1 may be greater than 5 μm, and in certain embodiments, it may be equal to or greater than 45 μm. The first laser mark M1 may be formed by melting a portion of the wafer 10 with the laser beam, and thus, the protrusion P1 may be formed near the first laser mark M1 on the first surface 11a. In certain embodiments, more than one first laser mark M1 may be formed, and the number of first laser marks M1 may be selected based on the specification of a position perceiving system.

Figure 11B:
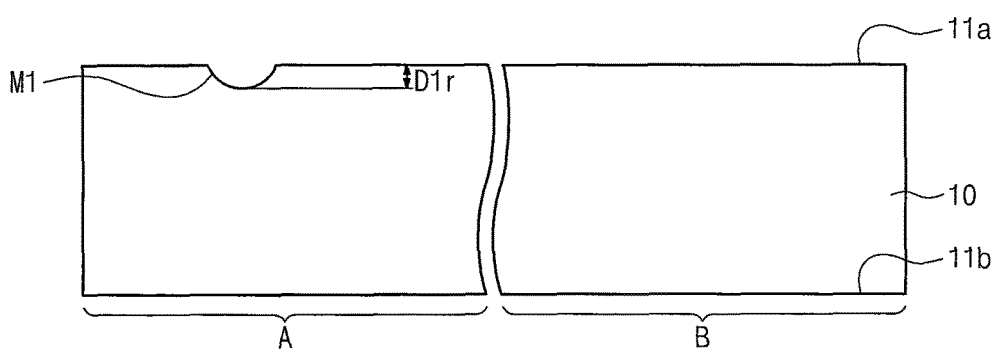

Referring to FIGS. 11A and 11B, the surface polishing process S30 may be performed to remove a first thickness T1 of the wafer 10. Accordingly, the first laser mark M1 may have a first remaining depth D1r that is less than the first depth D1. The first remaining depth D1r may be less than 5 µm.

Figure 11C:
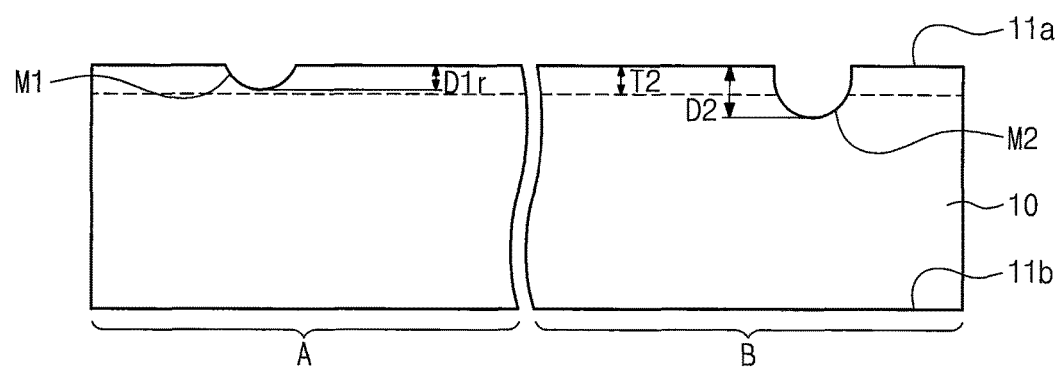

Referring to FIG. 11C, a second laser mark M2 may be formed on the wafer 10. The second laser mark M2 may be formed in the second region B in the first surface 11a. The second laser mark M2 may be formed by a laser beam, having an energy level that is in the energy range of soft laser marking. The second laser mark M2 may be formed to have the second depth D2. The second depth D2 may be greater than the first remaining depth D1r. The second laser mark M2 may be formed using a laser beam, having an energy level that is less than that used to form the first laser mark M1 which may reduce the likelihood of forming the protrusion P1.

Figure 11D:
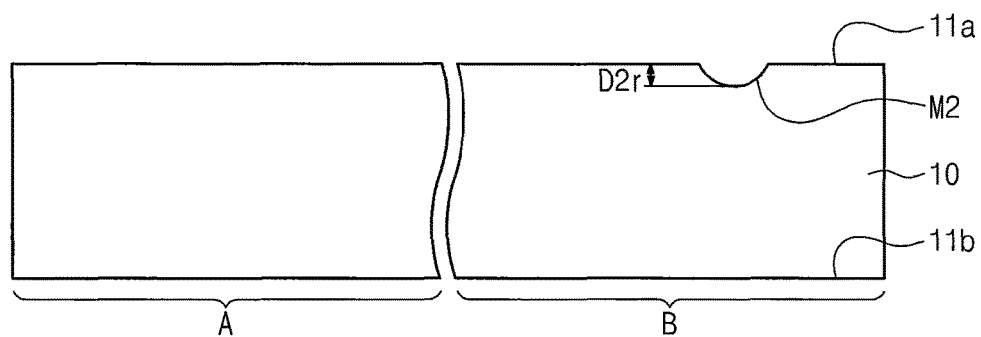

Referring to FIGS. 11C and 11D, the surface polishing process S30 may be again performed to remove a second thickness T2 from the wafer 10 that is greater than the first remaining depth D1r and is less than the second depth D2. Accordingly, the first laser mark M1 may be removed, and the second laser marks M2 having a second remaining depth D2r may remain on the wafer 10.

In certain embodiments, the second remaining depth D2r may be equal to or less than 5 µm. Here, as described with reference to FIG. 10A and FIG. 10B, the shape of the second laser mark M2 may be varied, and in some embodiments, the second laser mark M2 may serve as an indicator of the predetermined crystal orientation of the wafer 10.

FIGS. 12A through 12E are sectional views illustrating wafer production methods according to example embodiments of the inventive concept.

Figure 12A:
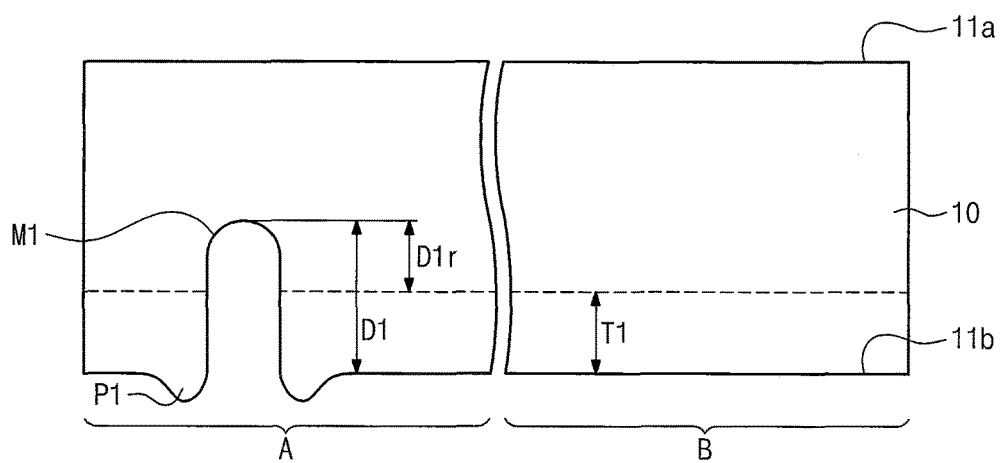
FIGS. 12A through 12E are sectional views illustrating wafer production methods according to example embodiments of the inventive concept.

Referring to FIG. 12A, a first laser mark M1 may be formed on the wafer 10 to indicate the predetermined crystal orientation of the wafer 10. One of the first and second surfaces 11a and 11b may be the front surface of the wafer 10, and the other may be the back surface of the wafer 10. The first laser mark M1 may be formed in the second surface 11b in the first region A. The first laser mark M1 may be formed by a laser beam, having an energy level that is in the energy range of hard laser marking. The first laser mark M1 may be formed to have a bottom at a first depth D1. The first depth D1 may be greater than 5 µm, and in certain embodiments, it may be equal to or greater than 45 µm. The first laser mark M1 may be formed by melting a portion of the wafer 10 with the laser beam, and thus, a protrusion P1 may be formed near the first laser mark M1 on the second surface 11b. In certain embodiments, more than one of first laser mark M1 may be formed, and the number of the first laser marks M1 may be changed so as to be detectable by a position perceiving system.

Figure 12B:
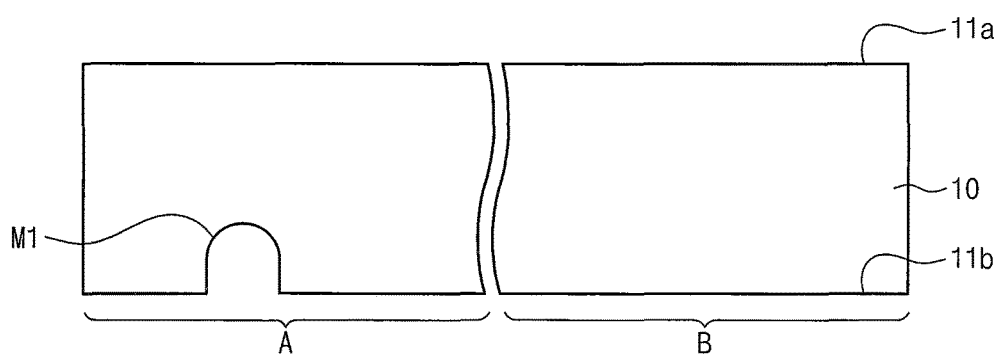

Referring to FIGS. 12A and 12B, the surface polishing process S30 may be performed to remove a portion T1 of the wafer 10. Accordingly, the first laser mark M1 may have a first remaining depth D1r that is less than the first depth D1.

Figure 12C:
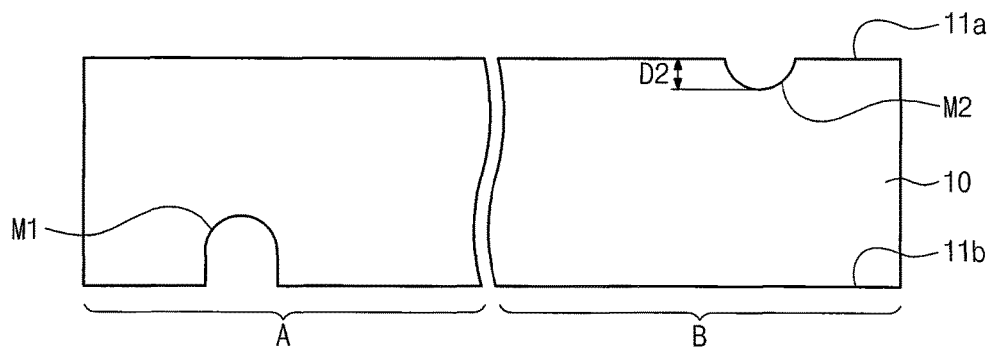

Referring to FIG. 12C, a second laser mark M2 may be formed on the wafer 10. The second laser mark M2 may be formed in the second region B (in the first surface 11a.) The second laser mark M2 may be formed by a laser beam, having an energy level that is in the energy range of soft laser marking. The second laser mark M2 may be formed to have a bottom at a second depth D2. The second depth D2 may be equal to or less than 5 µm. The second laser mark M2 may be formed using a laser beam, having an energy level that is less than that for the first laser mark M1, which may prevent a protrusion P1 from being formed near the second laser mark.

Figure 12D:
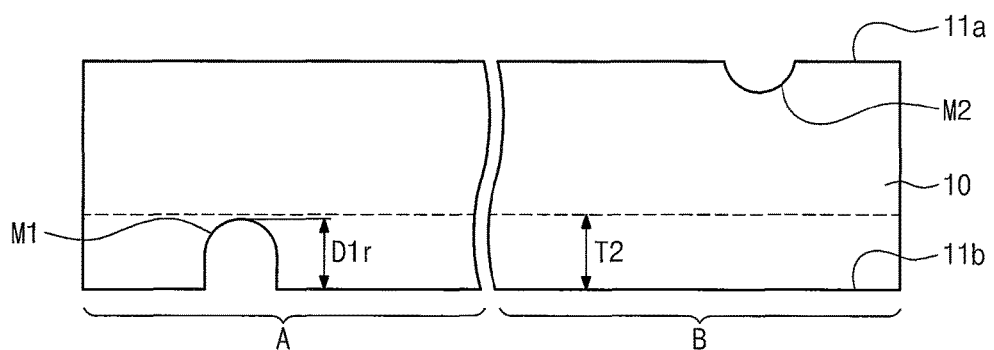
Figure 12E:
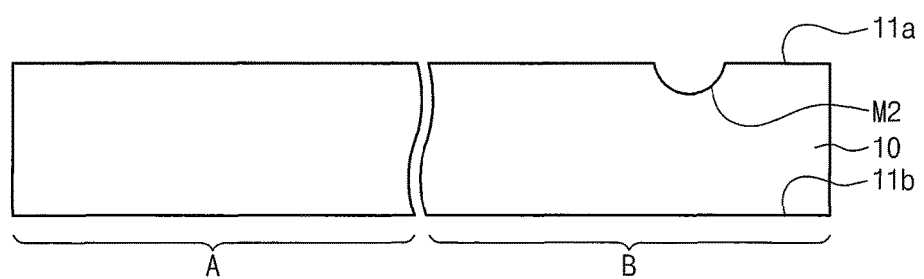

Referring to FIGS. 12D and 12E, the surface polishing process S30 may be again performed to the second surface 11b to remove a portion T2 of the wafer 10. The removed portion T2 of the wafer 10 may be thicker than the first remaining depth D1r. Accordingly, the first laser mark M1 may be removed, whereas the second laser marks M2 may remain on the wafer 10. Here, as described with reference to FIG. 10A and FIG. 10B, the shape of the second laser mark M2 may be varied, and in some embodiments, the second laser mark M2 may serve as an indicator showing the predetermined crystal orientation of the wafer 10.

According to the methods described with reference to FIGS. 11A through 11D and FIGS. 12A through 12E, the wafer 10 may include only the second laser mark M2 having a bottom at a depth of 5 µm or less, although more than one of the second laser marks M2 may be formed. Accordingly, it is possible to address problems (for example, breakage of the wafer or the formation of particles), which may be caused by the presence of first laser marks M1.

Figure 13:
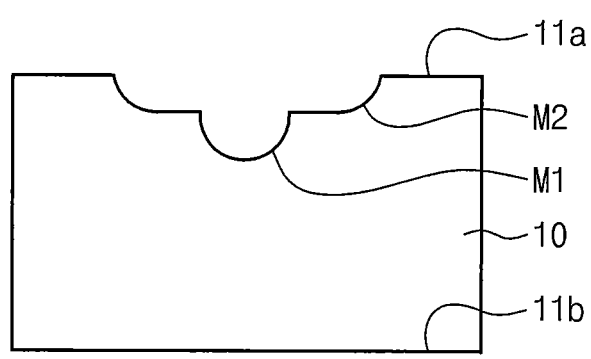
FIG. 13 is a sectional view illustrating a portion of a wafer according to example embodiments of the inventive concept.

FIG. 13 is a sectional view illustrating a portion of a wafer according to example embodiments of the inventive concept.

Referring to FIG. 13, a second laser mark M2 may be formed to have a line-shaped groove structure, where as a first laser M1 may have a dot shape. Moreover, the first laser mark M1 and the second laser mark M2 may overlap as shown. FIG. 13 may be a sectional view illustrating a portion of the laser marks shown in FIG. 9D.

Figure 14A:
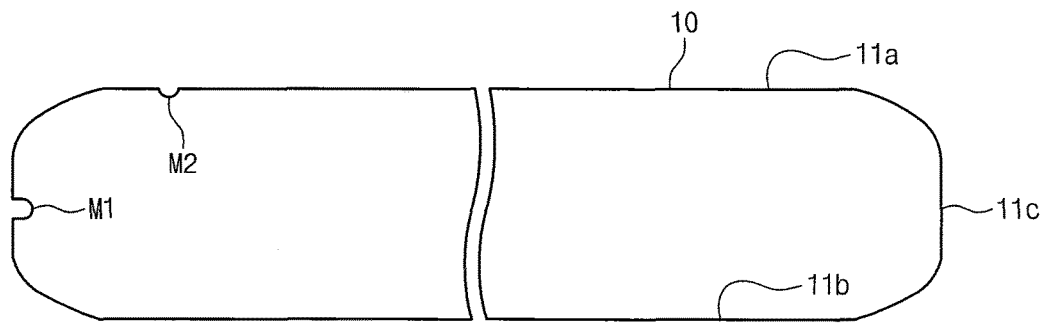
FIGS. 14A through 14C are sectional views illustrating wafers according to example embodiments of the inventive concept.
Figure 14B:
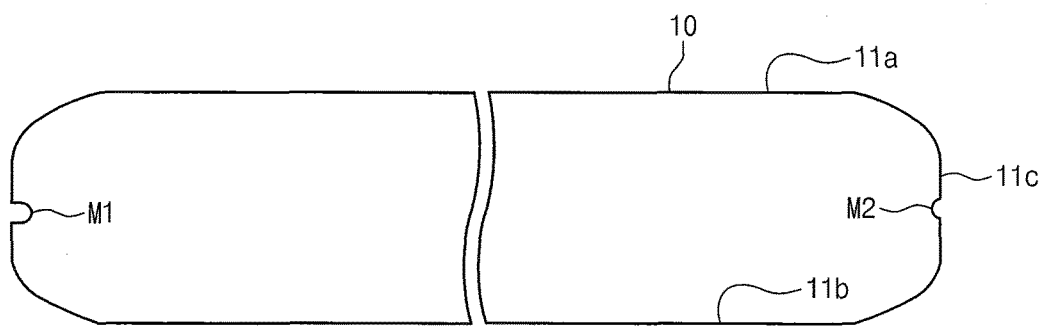
Figure 14C:
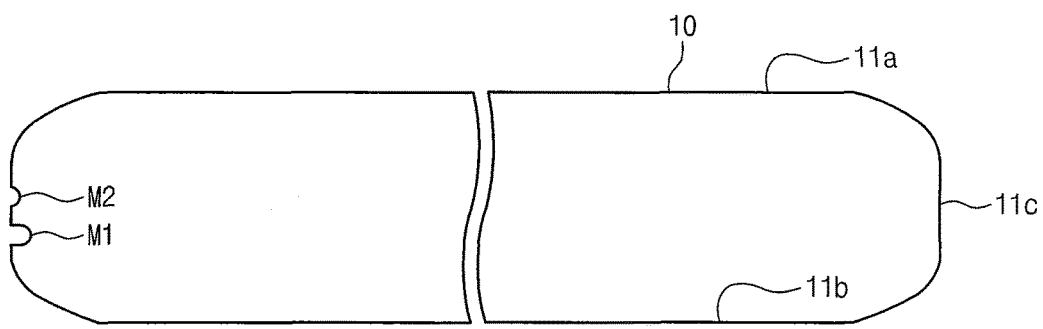

FIGS. 14A through 14C are sectional views illustrating a wafer according to even other example embodiments of the inventive concept.

As shown in FIG. 14A, a first laser mark M1 may be formed on a side (or edge) surface 11c of the wafer 10, and a second laser mark M2 may be formed on a first surface 11a of the wafer 10. In this case, a protrusion P1 may be formed on the side surface 11c of the wafer 10. An edge grinding process may be additionally performed to remove the protrusion P1 from the side surface 11c of the wafer 10.

Alternatively, as shown in FIG. 14B, a first laser mark M1 may be formed on a portion of a side surface 11c of the wafer 10, and a second laser mark M2 may also be formed on a side surface 11c. In some embodiments, first and second laser marks M1 and M2 can be on separate portions of the side surface 11c.

As shown in FIG. 14C, a first laser mark M1 and a second laser mark M2 may be formed adjacent to each other on a side surface 11c of the wafer 10.

In certain embodiments, the wafer 10 may be formed to further include at least one third laser mark. The at least one third laser mark may constitute one of letter, character, sign, symbol, serial number, quick response (QR) code, or bar code indicating additional information on the wafer 10, which may be different from information given by the first and/or second laser marks M1 and M2. The at least one third laser mark may be formed to have a depth that is less than that of the first laser mark M1. For example, the at least one third laser mark may be formed to have a depth of 5 µm or less.

In a wafer production method according to example embodiments of the inventive concept, before performing a surface polishing process S30, at least one first laser mark M1 may be formed at a determined position on a wafer 10 to indicate a predetermined crystal orientation of the wafer 10, and after the surface polishing process S30, at least one second laser mark M2 may be formed on the wafer 10 to represent information regarding the wafer 10. The first laser mark M1 may be deeper than the second laser mark M2. For example, the second laser mark M2 may have a depth of 5 µm or less. According to example embodiments of the inventive concept, the formation of the first laser mark M1 may be minimized, if the presence of such a first laser mark M1 can be perceived by a fabrication system. For example, any laser mark having a depth of 5 µm or greater may not be provided on the wafer 10, or the number of the first laser marks M1 formed on the wafer may be minimized. This may reduce the breakage of wafers so formed and reduce failures caused by the presence of a deep mark (e.g., the first laser mark M1).

While example embodiments of the inventive concepts have been particularly shown and described, it will be understood by one of ordinary skill in the art that variations in form and detail may be made therein without departing from the spirit and scope of the attached claims.

What is claimed:

1. A wafer including a single crystalline semiconductor material with a predetermined crystal orientation, the wafer comprising:
    a first laser mark at a determined position on a front surface or on a back surface of the wafer, wherein the first laser mark has a bottom at a first depth, and wherein the determined position is configured to indicate the predetermined crystal orientation of the single crystalline semiconductor material; and
    a second laser mark on the front surface or on the back surface of the wafer, wherein the second laser mark has a bottom at a second depth that is less than the first depth, and wherein the second laser mark is included in indicia that uniquely identifies the wafer and/or a wafer lot in which the wafer is included.

2. The wafer of claim 1 wherein the first laser mark is deeper than the second laser mark by at least about 5 micrometers.

3. The wafer of claim 2, wherein the second depth is equal to or less than 5 micrometers.

4. The wafer of claim 3, wherein the first depth is equal to or greater than 35 micrometers.

5. The wafer of claim 3, wherein the indicia comprises an alphanumeric code, a bar code, and/or a QR code,
    wherein the second laser mark comprises a plurality of second laser marks that are included in the indicia, and the first laser mark comprises at least one first laser mark that is included in the indicia, and
    wherein a number of the plurality of second laser marks included in the indicia is greater than a number of the at least one first laser mark included in the indicia.

6. The wafer of claim 1 wherein the first laser mark and the second laser mark are separated on the front surface or on the back surface of the wafer by a predetermined spacing.

7. The wafer of claim 1 wherein the first laser mark is included in the indicia.

8. The wafer of claim 7 wherein the indicia comprises an alphanumeric code, a bar code, and/or a QR code.

9. The wafer of claim 1 wherein the first laser mark is configured to indicate the predetermined crystal orientation with a line extending from a center of the wafer to the first laser mark.

10. The wafer of claim 1 further comprising:
    an edge surface providing a circumference of the wafer, wherein the edge surface extends from the front surface of the wafer to the back surface of the wafer.

11. The wafer of claim 1 wherein the first laser mark is at least partially in the second laser mark.

12. A wafer including a single crystalline semiconductor material with a predetermined crystal orientation, the wafer comprising:
    a first recess having a bottom at a first depth at a first determined position on a first surface of the wafer, the first determined position configured to indicate the predetermined crystal orientation of the single crystalline semiconductor material; and
    a second recess having a bottom at a second depth at a second determined position on a second surface of the wafer, wherein the first depth is greater than the second depth by at least about 5 micrometers.

13. The wafer of claim 12 wherein the first surface comprises an edge surface of the wafer and the second surface comprises any one of the edge surface, a front surface of the wafer, or a back surface of the wafer that is opposite the front surface.

14. The wafer of claim 12, wherein the first depth is equal to or greater than 35 micrometers.

15. The wafer of claim 14, wherein the second depth is equal to or less than 5 micrometers.

16. The wafer of claim 15, wherein the second recess is included in indicia that uniquely identifies the wafer and/or a wafer lot in which the wafer is included.

17. A wafer including a single crystalline semiconductor material with a predetermined crystal orientation, the wafer comprising:
    a first laser mark at a determined position on a front surface or on a back surface of the wafer, the first laser mark having a bottom at a first depth; and
    a second laser mark on the front surface or on the back surface of the wafer, the second laser mark having a bottom at a second depth that is less than the first depth by at least about 5 micrometers.

18. The wafer of claim 17, wherein the second depth is equal to or less than 5 micrometers.

19. The wafer of claim 18, wherein the wafer comprises indicia that uniquely identifies the wafer and/or a wafer lot in which the wafer is included and comprises an alphanumeric code, a bar code, and/or a QR code,
    wherein the second laser mark comprises a plurality of second laser marks that are included in the indicia, and the first laser mark comprises at least one first laser mark that is included in the indicia, and
    wherein a number of the plurality of second laser marks included in the indicia is greater than a number of the at least one first laser mark included in the indicia.

20. The wafer of claim 18, wherein the first laser mark comprises at least one first laser mark, and the second laser mark comprises a plurality of second laser marks, and
    wherein a number of the plurality of second laser marks is greater than a number of the first laser mark.

* * * * *